United States Patent [19]

Chen et al.

[11] Patent Number: 4,994,773

[45] Date of Patent: Feb. 19, 1991

[54] DIGITALLY CONTROLLED MONOLITHIC ACTIVE PHASE SHIFTER APPARATUS HAVING A CASCODE CONFIGURATION

[76] Inventors: Tzu H. Chen, 1 Braddock Rd., East Brunswick, N.J. 08816; Mahesh Kumar, 112 Nassau Dr., Lawrenceville, N.J. 08648

[21] Appl. No.: 257,482

[22] Filed: Oct. 13, 1988

[51] Int. Cl.$^5$ ............................................. H03H 11/20
[52] U.S. Cl. .................................... 333/164; 333/104; 330/277; 330/311; 307/571
[58] Field of Search ............... 333/164, 161, 156, 103, 333/104, 101; 307/571, 584; 330/310, 311, 277

[56] References Cited

U.S. PATENT DOCUMENTS

| 4,405,907 | 9/1983 | Breese et al. ..................... 333/164 X |
| 4,458,219 | 7/1984 | Vorhaus ............................. 333/164 |
| 4,549,152 | 10/1985 | Kumar ................................. 332/23 |
| 4,599,585 | 7/1986 | Vorhaus et al. .................... 333/164 |

OTHER PUBLICATIONS

Selin, John R.; "Continuously Variable L-Band Monolithic GaAs Phase Shifter"; *Microwave Journal;* Sep. 1987; pp. 211-218.
Naster et al.; "Affordable MMIC Designs for Phased Arrays"; *Microwave Journal;* Mar. 1987; pp. 141-148.
Microwave Semiconductor Circuit Design, W. Allen Davis, Van Nostrand Reinhold Co. (1984), pp. 264-293.
Monolithic Dual-Gate AsAs FET Digital Phase Shifter, J. L. Vorhaus et al., IEEE Trans. on Microwave Theory and Techniques, vol. MTT-30, No. 7, Jul. 1982, pp. 982-991.
A Monolithic Single-Chip X-Band Four-Bit Phase Shifter, Y. Ayasly, et al., IEEE Trans. on Microwave Theory and Tech., vol. MTT-30, No. 12, Dec. 1982, pp. 2201-2205.

*Primary Examiner*—Eugene R. LaRoche
*Assistant Examiner*—Benny Lee

[57] ABSTRACT

A digitally controlled active phase shifter with vernier control consists of a 180 degree phase bit in series with a 90 degree bit and a digitally controlled active vector generator with vernier control. The digitally controlled active vector generator consists of an active power divider with digitally adjustable amplitude, a pair of phase delay networks with an active power combiner employing vernier control. The power divider consists of two sets of parallel pairs of FET's in cascode configuration with all input nodes connected together and all output nodes from the same set tied together. The FET at the output node of each pair is a common gate configuration with its gate RF grounded through a bypass capacitor. The gate bias voltage is applied to the common gate FET to switch it ON or OFF to thereby provide a set of desired signal amplitudes which can be obtained by selecting the gain of each of the cascode stages in each of the parallel pairs. Two output signals from the power divider are fed into a pair of phase delay networks to get 90 degree phase differences. The two 90 degree out of phase signals are then combined by an active power combiner which consists of two pairs of FET's in cascode configuration with their output nodes connected together. The combined signal while maintaining constant amplitude can have phase variations beteen 0-90 degrees according to the amplitude ratio of the two 90 degree out of phase signals. The gate bias voltage applied to the two common gate FET's of the power combiner can be varied continuously to give additional phase variations of the combined signal at the output.

27 Claims, 7 Drawing Sheets

DIGITALLY CONTROLLED MONOLITHIC ACTIVE PHASE SHIFTER APPARATUS HAVING A CASCODE CONFIGURATION

RELATED COPENDING APPLICATIONS

In regard to the present application which involves a digital controlled monolithic active phase shifter, the following copending applications are generally related to monolithic microwave circuits.

See patent application entitled A MONOLITHIC ACTIVE DIGITAL ATTENUATOR/AMPLIFIER APPARATUS, Ser. No. 07/247,966 filed on Sept. 22, 1988.

See a copending application entitled DIGITALLY CONTROLLED VARIABLE GAIN POWER DIVIDER APPARATUS PARTICULARLY ADAPTED FOR MICROWAVE APPLICATIONS Ser. No. 07/247,979, filed on Sept. 22, 1988.

See a copending application entitled DIGITALLY CONTROLLED MONOLITHIC ACTIVE SWITCH MATRIX filed on Oct. 7, 1988, Serial No. 07/255,092.

See also an application entitled BIDIRECTIONAL DIGITAL PHASE SHIFTER APPARATUS Ser. No. 07/255,082 filed on Oct. 7, 1988.

All of the above copending applications were filed for T. Chen and M. Kumar, the inventors herein and are assigned to the Siemens Corporation.

Certain of the above applications such as the MONOLITHIC ACTIVE DIGITAL ATTENUATOR as well as the DIGITALLY CONTROLLED VARIABLE GAIN POWER DIVIDERS show cascode implementations of MESFET's utilized to perform attentuation/gain as well as power division. Certain of the cascode circuits in these copending applications are employed herein.

The application entitled DIGITALLY CONTROLLED MONOLITHIC ACTIVE SWITCH MATRIX depicts certain circuit configurations also using cascode FET arrangements for power dividers and power combiners.

The application entitled BIDIRECTIONAL DIGITAL PHASE SHIFTER shows all pass LC constant resistance networks utilized in microwave phase shifters and which are employed herein.

BACKGROUND OF THE INVENTION

This invention relates to a digitally controlled active phase shifter and more particularly to a digitally controlled phase shifter employing components which can be formed by microwave monolithic integrated circuit (MMIC) techniques.

The introduction of phased array antennas with the capability of beam steering and multiple beams has provided a major application for phase shifters and time delay networks. The ideal phase shifter shifts a phase of an applied signal the same amount at all frequencies within a wide band. Phase shifters have been widely employed in the prior art. Such prior art phase shifters have utilized diode switching devices, such as PIN diodes and other switching devices as well. Such switched phase shifters are designated as switched line phase shifters, lowpass/highpass phase shifters, loaded-line phase shifters and circular or hybrid coupler reflection phase shifters.

See a text entitled *Microwave Semiconductor Circuit Design* by W. Allen Davis, published by Van Nostrand Reinhold Co. (1984) pages 264–293 chapter 13 entitled "Circuits Using Pin Diodes". As one can ascertain, the phase shifter is normally employed in a transmit/receive (T/R) module for uses in phased array antenna systems and in EW applications. As one will understand, active phase shifters are known in the art and these are the type of phase shifters that provide gain instead of loss. Lossy phase shifters incorporate passive devices. The size of an active phase shifter is much smaller than a passive phase shifter, and hence such active phase shifters are more desirable in regard to modern day technology.

As indicated above, such phase shifters are widely employed and particularly attractive in applications involving phased array antenna systems. Such antennas normally consist of an assembly of closely packed radiator elements which are driven by a microwave transmit/receive (T/R) circuit module. In a phased array radar the radiating elements are fed varying amplitude and phase signals to shape and position the beam. Passive phase shifters as indicated have been used in such arrays. The passive phase shifters are large in size even when used in hybrid MIC formats. There are difficulties involved with such phase shifters as above indicated.

For other pertinent background reference is made to a copending application Ser. No. 255,082 entitled BIDIRECTIONAL DIGITAL PHASE SHIFTER APPARATUS filed on Oct. 7, 1988 for T. Chen and M. Kumar, the inventors herein and assigned to Siemens Corporation, the assignee herein.

As one can ascertain from the above copending application, there is described a bidirectional phase shifter which can be implemented in monolithic format (MMIC). The phase shifter of the application operates in broad band operation with excellent amplitude and phase tracking. The phase shifter is a bidirectional phase shifter which employs constant resistance all pass LC networks which networks operate to pass wide bands of frequencies with any desired phase shift within the band. Such networks provide a constant phase delay while having superior amplitude characteristics for a wide band of input signals while avoiding many of the prior art problems. The copending application shows such all pass LC networks operating in conjunction with bidirectional single pole double throw (SPDT) switches fabricated from FET devices.

As also indicated in the copending application, the prior art has attempted to provide phase shifting apparatus utilizing active semiconductor devices such as MESFETS fabricated on gallium arsenide substrates employing MMIC technology. For an example of such prior art approaches, reference is made to U.S. Pat. No. 4,599,585 issued on July 8, 1986 and entitled N-BIT DIGITALLY CONTROLLED PHASE SHIFTER to J.L. Vorhaus et al. This patent discloses an N-bit digitally controlled phase shifter for controlling the phase of an applied signal in a range of zero to 360 degrees. As one can ascertain, the patent utilizes field effect transistors and transmission lines. Phase shift and incremental phase delay is obtained by switching the transistors to increase or decrease the effective length of the transmission lines.

Reference is also made to U.S. Pat. No. 4,458,219 entitled VARIABLE PHASE SHIFTER issued on July 3, 1984 to J.L. Vorhaus. This patent also shows a phase shifter which includes three cascade interconnected phase shift stages. Each stage includes a quadrature coupler and a pair of field effect transistors in a common source configuration. The patent discloses circuits which are employed by cascading various substages to obtain variable phase shifting utilizing the FET devices to select the signal paths through the required stages.

Reference is also made to U.S. Pat. No. 4,549,152 entitled BROAD BAND ADJUSTABLE PHASE MODULATION CIRCUIT issued on Oct. 25, 1985 to M. Kumar, one of the inventors herein and assigned to the RCA corporation. This patent shows a phase modulation circuit to provide at an output terminal an output signal which is controllably shifted from 0 to 360 degrees relative to an input signal. The patent shows the use of various amplifier stages which are employed to provide selective phase shifts and which are operated with gain to control the amount of phase shift through the circuit.

The above-noted patents apart from showing various active devices in different types of phase shifting networks show integrated circuit techniques which can be employed to implement phase shifters for microwave application.

For further examples of phase shifters employed for microwave operation, reference is made to an article entitled "Monolithic Dual Gate GaAs FET Digital Phase Shifter" by J.L. Vorhaus et al., published in *IEEE Transactions on Microwave Theory and Techniques*, Vol. MTT-30 No. 7, July 1982, pages 982 to 991. This article also describes monolithic microwave integrated circuit techniques utilized to provide various phase shifting devices.

Reference is also made to an article entitled "The Monolithic Single Chip X-Band 4-Bit Phase Shifter" by Y. Ayasli et al., published in the *IEEE Transactions on Microwave Theory and Techniques*. Vol. MTT-30 No. 12, December 1982, pages 20-201 to 20-205. This article shows the use of FET's as microwave switches employed with passive phase shifters which are capable of providing phase shift bits in predetermined increments. The article shows cascading of various stages to produce multi-bit digital phase shifters with low insertion losses which can be fabricated utilizing MMIC techniques on gallium arsenide substrates.

As one will understand when reviewing the above articles and patents, many such phase shifters employ gallium arsenide FET's or MESFET devices which are utilized as switches to essentially operate in conjunction with transmission lines, lowpass/highpass circuits, loaded lines or circulators and so on to produce variable phase shift characteristics of relatively wide bandwidths.

As indicated above, such phase shifters are subject to many problems in regard to operation, including input/output mismatch as well as nonlinear amplitude and phase shifting over relatively broad ranges.

It is a main object of the present invention to provide a digitally controlled phase shifter which operates with constant amplitude and excellent phase characteristics over a relatively wide bandwidth.

The subject matter phase shifter incorporates circuit components which are capable of being integrated using MMIC techniques on gallium arsenide substrates.

The digitally controlled monolithic active phase shifter according to the present invention utilizes active devices and cascode circuit configurations with common gate FET's employed as switching means. The cascode configuration as employed provides high isolation and excellent phase and amplitude stability.

The variation of the input impedance of the power dividers incorporated in the present invention is relatively small for all possible combinations and hence the circuit provides small incident phase changes. The circuit also employs a vernier control used with a power combiner and hence enables the capability of adjusting each phase bit to extremely fine accuracy. Due to the nature of the circuit components employed, the circuit is broad band and of relatively small size.

The circuit employs digital control signals which control signals are required, for example, in a phased array radar system to change the direction and the shape of the beam. The circuit can be easily implemented in integrated circuit form while employing components which are capable of being analyzed utilizing computer modeling and hence allowing easier design and circuit operation analysis.

BRIEF DESCRIPTION OF THE PREFERRED EMBODIMENT

A digitally controlled active phase shifter apparatus operative to shift the phase of a signal within a given frequency range as applied to an input terminal between 0-360 degrees at an output terminal, comprising phase bit means having an input adapted to receive said input signal to provide at an output a signal shifted in phase by a given phase angle, active power divider means having an input coupled to said output of said phase bit means, said power divider including first and second power divider paths, each path including a plurality of cascode FET devices, with each device comprising a first FET arranged in a cascode stage configuration with a second common gate FET, with the gate electrodes of said first FET's in each device connected together and coupled to said input and with the gate electrodes of said common gate FET's each adapted to receive a digital control signal for selectively biasing each cascode stage ON or OFF, with the drain electrodes of said common gate FET's in said first path connected together to provide a first output and with the drain electrodes of said common gate FET's in said second path connected together to provide a second output, a pair of phase delay networks with a first one operative to provide a given fixed phase delay and having an input coupled to said first output of said power divider, and a second one operative to provide an opposite polarity given phase delay and having an input coupled to said second output of said power divider, each of said phase delay networks having an output, an active power combiner means having a first and second pair of FET's each in a cascode configuration with one FET in said first pair having the gate electrode coupled to said output of said first network and one FET in said second pair having the gate electrode coupled to said output of said second network, with the other FET in each pair arranged in a common gate configuration and having the gate electrode adapted to receive a control signal, with the drain electrodes of said common gate FET's coupled together to provide an output terminal for said phase shifter, digital control means coupled to said gate electrodes of said common gate FET's of said power divider to select cascode stages of said power divider according to a desired phase shift to be implemented via said first and second paths, whereby said power combiner can combine said signals from said power divider to provide a phase shift for said input signal between 0–90 degrees at said output terminal.

DETAILED DESCRIPTION OF THE FIGURES

Figure 1:
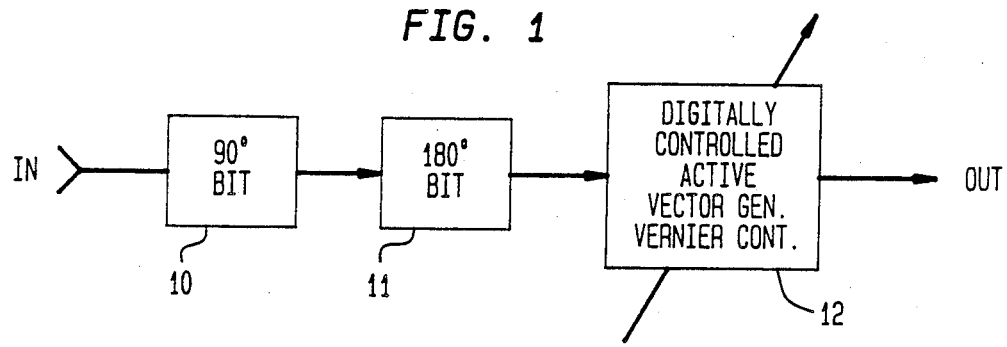
FIG. 1 is block diagram of a digitally controlled active phase shifter apparatus with vernier control according to this invention.

Referring to FIG. 1, there is shown a simple block diagram of a digitally controlled active phase shifter employing vernier control.

An input signal is directed to an input of a 90 degree bit phase shift device 10. The output of the 90 degree bit 10 is applied to the input of 180 degree bit phase shift device 11. The output of the 180 degree bit 11 is applied to the input of the digitally controlled active vector generator 12 which incorporates vernier control.

The 90 degree bit and the 180 degree bit can be either passive or active networks as will be further explained. The 90 degree bit 10 can be a bidirectional phase shifting device as can the 180 degree bit device 11. The vector generator 12 which is digitally controlled is preferably a unidirectional device and provide phase shifting between 0 to 90 degrees or phase shifting over other ranges as well. The basic phase shifter to be described can provide various phase degree increments as for example phase can be shifted in 11.25 degree increments for a 5-bit phase shifter or for a six bit phase shifter in increments of 5.625 degrees.

The digitally controlled active vector generator 12 has incorporated therein a vernier control whereby additional phase accuracy can be obtained with the circuit.

Figure 2:
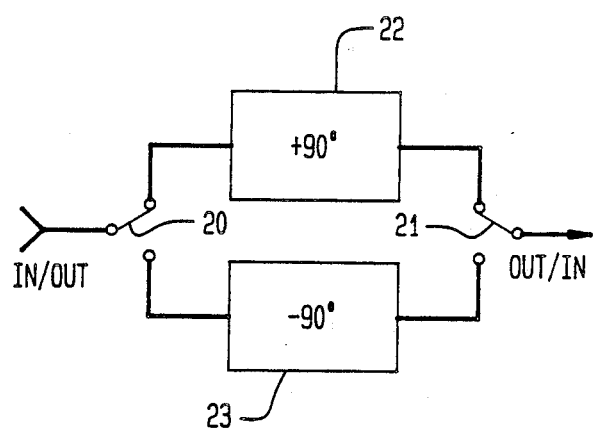
FIG. 2 is a block diagram showing a passive 180 degree bit circuit configuration.

Referring to FIG. 2, there is shown a passive 180 degree phase shifter. The phase shifter is bidirectional and can therefore phase shift signals from the input to the output port or from the output to the input port. The phase shifter has for example at an input port a single pole double throw (SPDT) switch 20. The SPDT switch 20 is implemented by bidirectional FET devices and can select the input of a first all pass LC network 22 or a second all pass network 23. The first network 22 can provide a wide band phase shift of the input signals of +90 degrees over the range. The phase shift circuit 23 can provide a wide band phase shift of −90 degrees. The output of networks 22 and 23 are directed to an output SPDT switch 21 of the same configuration as switch 20 and hence either output of network 22 or 23 can be selected.

Figure 3:
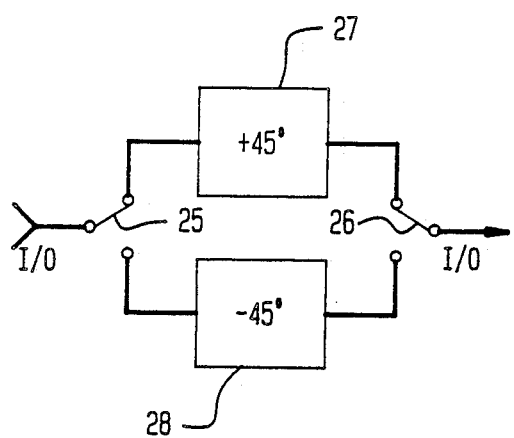
FIG. 3 is a block diagram showing a passive 90 degree bit circuit configuration.

Referring to FIG. 3, there is shown a 90 degree passive bit phase shift circuit which is also bidirectional. As one can see, the circuit configuration of FIG. 3 is the same exact circuit configuration of FIG. 2 with the exception there is a first and second all pass network 27 and 28 each of which provides a phase shift of 45 degrees but of opposite polarity. The input of either network 27 or 28 is selected by means of an SPDT switch 25 while the output is selected by means of an SPDT switch 26. The circuit configurations of switches 25 and 26 are the same as those of 20 and 21 which will be described in greater detail.

Reference is made to the copending application entitled BIDIRECTIONAL DIGITAL PHASE SHIFTER APPARATUS, Ser. No. 255,082, filed on Oct. 7, 1988. In that patent application there is shown phase shifters which are bidirectional in operation and can be implemented in monolithic format (MMIC). The phase shifters in that application are bidirectional devices which essentially employ constant resistance all pass LC networks which networks operate to pass wide bands of frequencies with any desired phase shift in the band. The copending patent application describes many examples of phase shifters as well as circuit configurations which can be employed to implement the passive phase shifters shown in FIG. 2 and FIG. 3.

Figure 4:
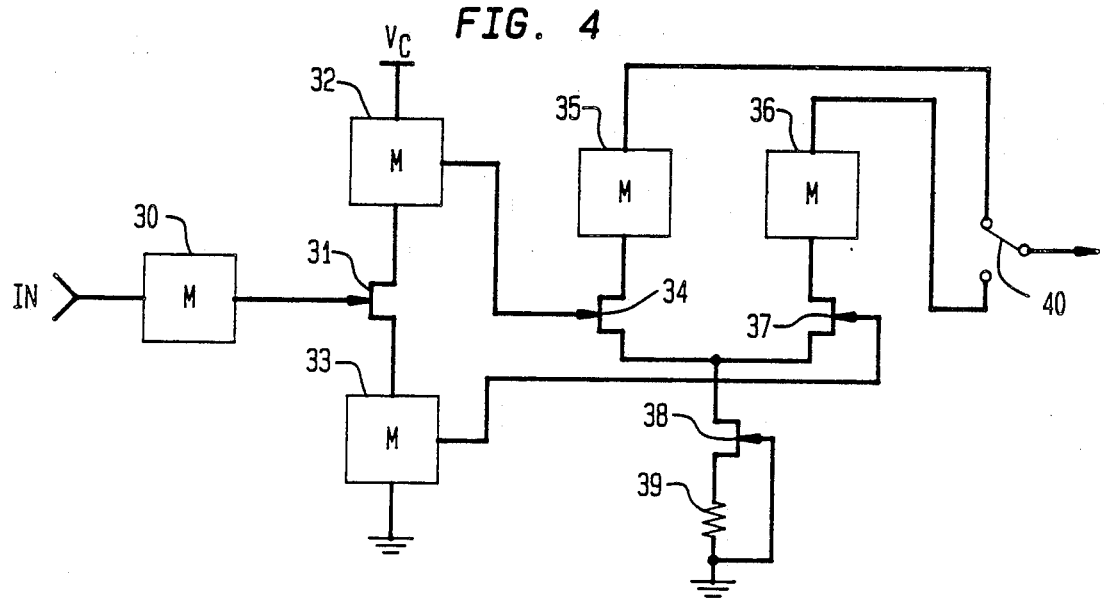
FIG. 4 is a schematic diagram showing an active 180 degree bit.

Referring to FIG. 4, there is shown an 180 degree bit which is an active configuration. As seen in FIG. 4, an input signal to be phase shifted is applied to the input of a matching network 30. The output of the matching network 30 is applied to the gate electrode of a field effect transistor or FET 31. The matching network 30 serves to match the impedance at the input to the impedance at the gate electrode of the transistor 31 and is a relatively well known circuit configuration. The drain electrode of transistor 31 is coupled through a matching network 32 to a source of biasing potential $+V_C$ while the source electrode of the FET 31 is coupled through a matching network 33 to a point of reference potential.

The output of matching network 32 is applied to the gate input of a field effect transistor 34 while the output of matching 33 is applied to the gate input of a field effect transistor 37. Transistors 34 and 37 are arranged in a differential amplifier configuration having the source electrodes connected together and coupled to a point of reference potential through a current source consisting of FET 38. FET 38 has the gate electrode coupled to ground and has a resistor 39 in series with the source electrode. The differential amplifier configuration which consists of transistors 34 and 37 including the current source 38 is well known. The output drain electrodes of transistors 34 and 37 are directed through respective matching networks 35 and 36 to provide two output terminals for the active 180 degree phase bit. Each of the outputs are coupled to contacts of an output SPDT switch 40 which is of the same configuration as switches 20, 21, 25, 26. As one can understand, the input signal is split in phase by means of FET 31 whereby the output for matching network 32 is 180 degrees out of phase with the output from matching network 33. The respective outputs are applied to the gate electrodes of FET's 34 and 37 which again provide two signals each 180 degrees out of phase with one another.

It is, of course, understood that the field effect transistors as shown in FIG. 4 may be MESFET's fabricated on gallium arsenide substrates utilizing MMIC techniques. The devices are depicted as N-channel devices but could be of opposite conductivity as well. The output SPDT switch 40 can select the signal from the drain electrode of FET 34 via the matching network 35 of a +90 degree phase shift, while the output switch can also select the output from matching network 36 of −90 degree phase shift.

Figure 5:
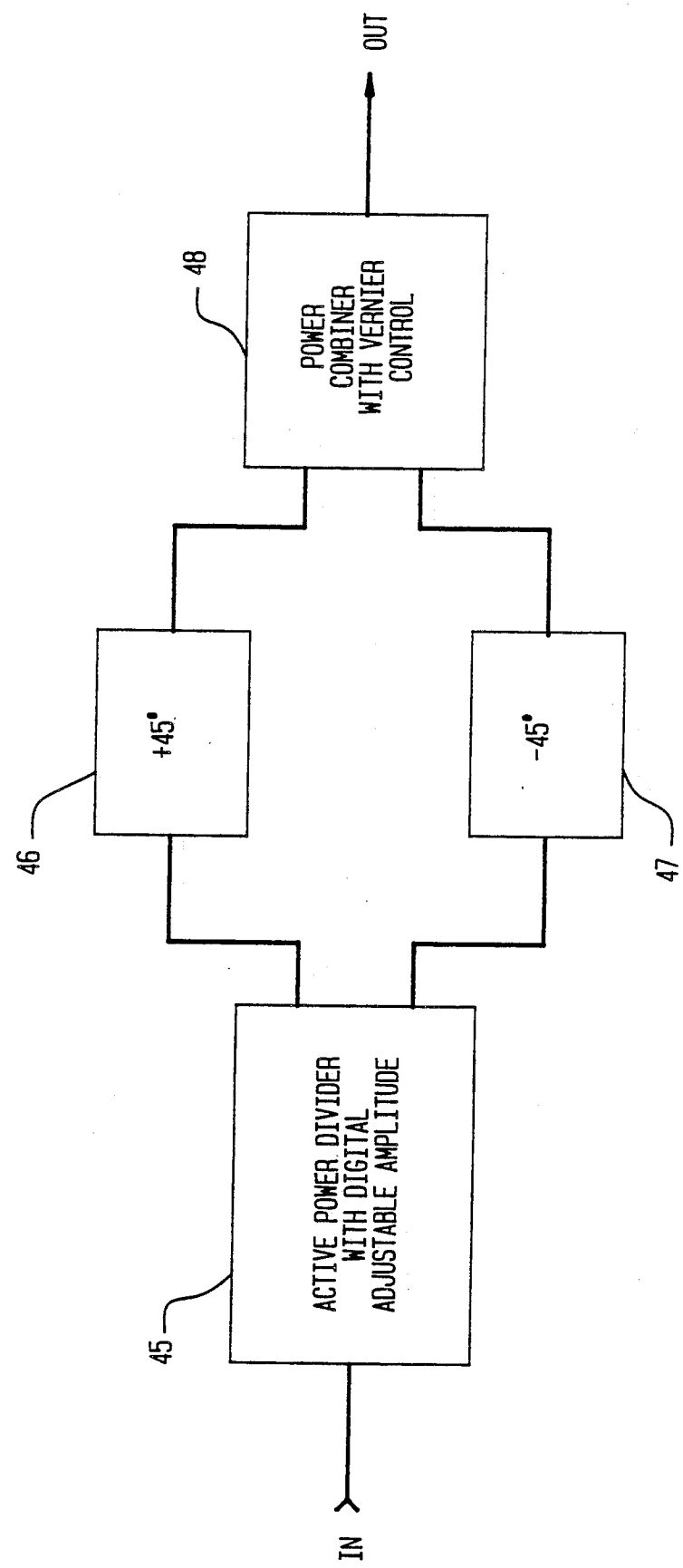
FIG. 5 is a block diagram of a digitally controlled active vector generator with vernier control.

Referring to FIG. 5, there is shown a simple block diagram of a digitally controlled active vector generator including vernier control. Essentially, as seen in FIG. 5, the vector generator consists of an input stage which is an active power divider 45 with digital adjustable amplitude. The active power divider 45 has first and second outputs. The first output of the divider is applied to a first phase delay network 46 with the second output applied to a second phase delay network 47. The phase delay networks 46 and 47 are again passive networks employing all pass LC networks wherein network 46 provides a phase delay of +45 degrees while network 47 provides a phase delay of −45 degrees. The outputs of networks 46 and 47 are coupled to the inputs of a power combiner with vernier control 48.

Figure 6:
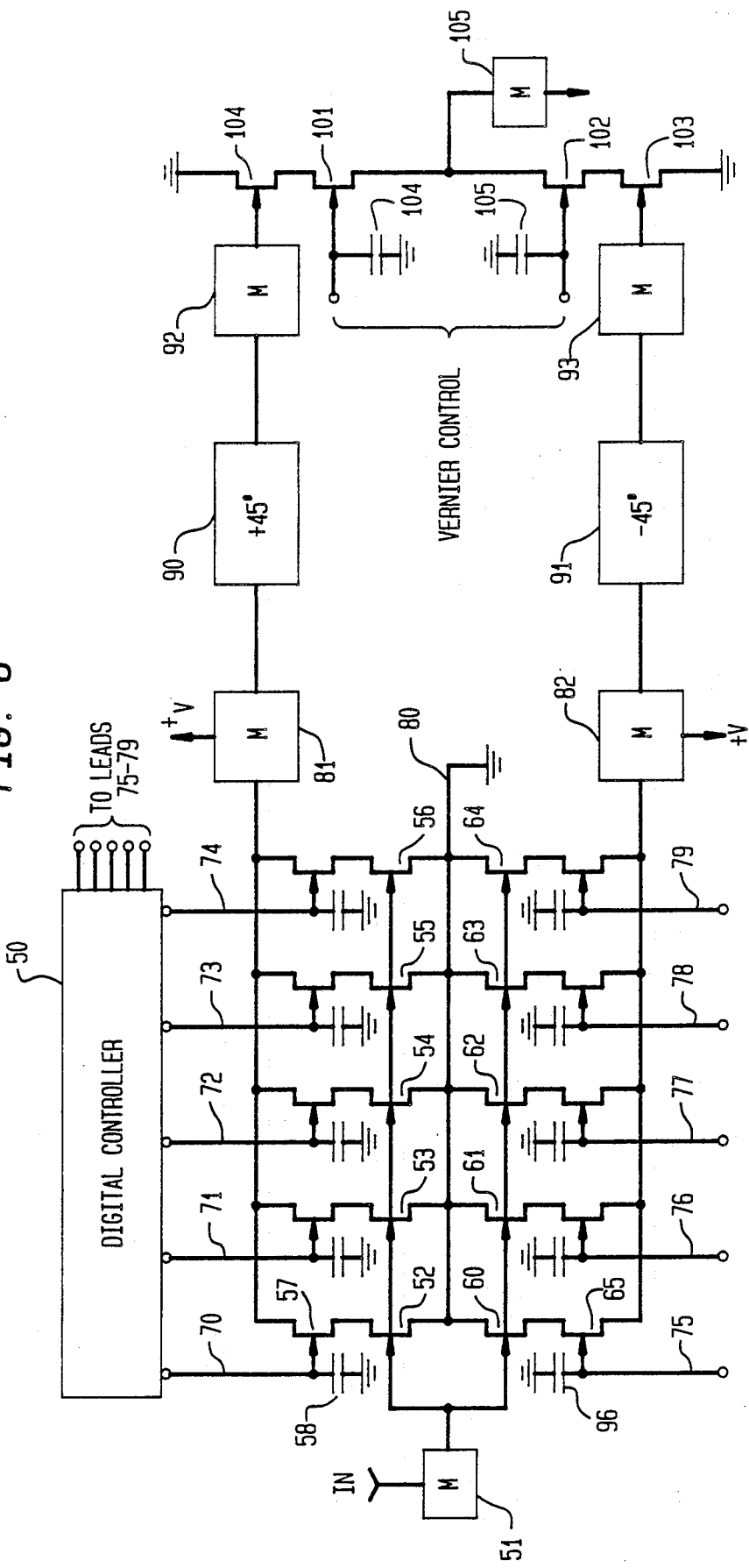
FIG. 6 is a schematic diagram of a digitally controlled active generator with vernier control

Referring to FIG. 6, there is shown a schematic diagram of an active power divider and a power combiner with vernier control. The power divider consists of two sets of parallel pairs of FET's in cascode configuration with all input nodes connected together and all output nodes from the same set or pair tied together. One set of cascode FET's provides one output path, while the other set provides the other output path. The FET at the output node of each pair is in a common gate configuration with its gate RF grounded by a suitable bypass capacitor. The gate bias voltage is applied to the common gate FET to switch it on as by a positive voltage or to switch it off by applying a negative bias.

An example of a suitable circuit for the active power divider can be had by reference to the copending application entitled DIGITALLY CONTROLLED VARIABLE GAIN POWER DIVIDE APPARATUS PARTICULARLY ADAPTED FOR MICROWAVE APPLICATION Ser. No. 07/247,979 filed Sept. 22, 1988 and as indicated above. The operation of the circuit is as follows. The power divider shown controls power in each of the two output paths by means of a digital controller module 50. The digital controller module 50 may be a digital computer or other digital circuit providing the necessary digital codes to bias selected cascode stages accordingly. As will be explained, the power in the two paths can either be equally divided or divided unequally.

As seen, an input signal is applied via a matching network 51. The output of the matching network 51 is coupled to the gate electrodes of FET's 52, 53, 54, 55 and 56. Each of the FET's as 52 to 56 operates in a cascode amplifier configuration and each has an associated FET arranged in a common gate configuration and having its gate electrode RF bypassed to ground through a bypass capacitor. Hence, FET 57 has its drain-to-source path in series with FET 52. The gate electrode of FET 57 is bypassed to ground via capacitor 58. Every other FET in the first path as 53, 54, 55, and 56 is also associated with a common gate FET with each of the common gate FET's having the gate electrodes coupled to ground by a suitable capacitor.

In a similar manner a second path consists of FET's 60, 61, 62, 63 and 64. These FET's as 60–64 also have the gate electrodes coupled to the output of the matching networks 51 and each are associated with a common gate FET having the gate electrode RF bypassed to ground through a capacitor. For example, FET 60 is in series with the source-to-drain path of FET 65 where FET 65 has the gate electrode bypassed to ground through capacitor 66. Each of the common gate FET's is operative to switch the respective cascode amplifier on or off. This is done by applying a suitable bias signal to the gate electrode of the common gate FET. These bias input terminals are designated in the Figure as 70–79. Thus, as one can ascertain, the digital controller can operatively select and apply a positive bias to any of the leads 70–79 or apply a negative bias to any of the leads 70–79. If a positive bias is applied to lead 70 then the cascode amplifier consisting of FET's 52 and 57 will be turned on. A negative bias on lead 70 as applied to the gate electrode of FET 57 will turn the cascode amplifier OFF. As one can ascertain from the Figure, all the source electrodes of the FET's in both paths are connected together and are coupled to a point of reference potential 80. As one can further see from the Figure, all the drain electrodes of the five common gate FET's are connected together for the first path to a matching network 81. The drain electrodes of the five FET's for the second path are connected together and to a matching network 82. Both matching networks 81 and 82 are operative to transfer the impedance from the FET devices to a specified value such as 50 Ohms and further to couple the connected FET devices to a suitable source of operating potential designated as (+V).

As indicated above, the exact details of the power divider shown including digital control of the same is described in detail in the copending application. It is, of course, understood that the cascode configuration of the FET devices as for example shown in FIG. 6 provides extremely high isolation between the two outputs at matching networks 81 and 82. As one will further understand, cascode arrangements as provided in each path enables the input signal to be multiplied by a gain factor which is the sum of the gain of each of the various stages included in the signal path.

As is known, the gain of an FET device is a function of its transconductance. The transconductance is also a function of the gate width of the FET devices. Hence, FET devices such as 52 and 57 can be fabricated to have one particular gate width as compared to the gate width of other cascode FET's Hence, by selecting the gate widths of the FET stages, each of the cascode amplifier stages in each path can provide a different gain factor. Due to the different gain factors, power distribution in both paths can be made different or equal depending upon the selection by the digital controller 50. Hence, different gains for one path as compared to the other path or the same gain for both paths can be provided. Thus, as one will understand, a set of desired signal amplitudes can be obtained by selecting the gate width of the FET's to provide ratios in regard to all pairs in the same set and to provide combinations of digital control signals to obtain different amplitude signals in each path. Thus, by selectively varying the gate widths of cascode arrangements of FET's in both signal paths and by controlling which FET's are operated by means of the digital controller 50 one can provide a wide range and combination of output signals as controlled. The output signal from the first path via the matching network 81 is applied to an input of an all pass LC network 90. The all pass network 90 is a bidirectional passive network and provides a phase shift of +45 degrees.

The output of network 90 is directed to the input of a matching network 92 whose output is directed to the gate electrode of an FET 100. The source electrode of the FET 100 is directed to a point of reference potential and is in series with the source-to-drain path of a common gate FET 101. The FET 101 has its gate electrode bypassed to ground through a capacitor 104. The drain electrode of FET 101 is coupled to the drain electrode of an FET 102 also having its gate electrode bypassed to ground via a capacitor 105. The source electrode of transistor 102 is coupled to the drain electrode of transistor 103 having its source electrode again coupled to a point of reference potential. The gate electrode of transistor 103 is coupled to the output of a matching network 93 indicative of the second path.

As one can ascertain from FIG. 6, the drain output of the common gate FET's as coupled to FET's 60–64 in the second path via matching network 82 is coupled to the input of a −45 degree all pass phase shift network 91. The output of the network 91 is coupled to the gate electrode of FET 103 via the matching network 93. In this manner the output for the circuit is obtained via a matching network 105 which couples the drain electrodes of transistors 101 and 102 to a suitable source of operating potential and provides for impedance matching as is well known. As can be seen, by applying suitable biasing potentials to the gate electrodes of transistor 101 and 102, one can obtain a selective combination of the two signals as applied to the gate electrodes of transistors 100 and 103. As indicated, the two output signals obtained from the power divider are fed into the pair of phase delay networks 90 and 91 to derive 90 degree phase differences. The two 90 degree out-of-phase signals are then combined by the active power combiner which comprises the two pairs of FET's in cascode as 100, 101, and 102 and 103 with their output nodes connected together.

The combined output signal, has a constant amplitude and can have phase variations between 0 and 90 degrees according to the amplitude ratio of the two 90 degree out-of-phase signals as applied to the gate electrodes 103 and 100. The gate bias voltage applied to the two common gate FET's as 101 and 102 may be varied continuously to give additional phase variation of the combined output signal via the output matching network 105.

The power divider affords power distribution which can be equally or can be unequally divided between the output paths. The digitally controlled variable gain power divider as indicated above provides power division with gain and is capable of variable power division between each channel. The circuit operates via the control by the digital controller 50 which either biases the common gate configurations on or off to thereby cause the cascode amplifier associated with the common gate configuration to operate or not operate. The circuit provides extremely high reverse isolation due to the cascode configuration as no current can flow when the common gate configuration is biased off and the larger separation between the input and the output as compared to the dual-gate FET. As indicated in the copending application, such power divider circuits can provide dynamic range of gain control between 30 to 40 db at frequencies of 15 GHz and higher and provide a greater control range at lower frequencies.

The circuit is of extremely small size and fabricated on a gallium arsenide substrate using monolithic integrated circuit techniques. Such monolithic integrated circuit techniques employing gallium arsenide will enable low cost and high volume application as for example necessary in a phased array radar system and similar systems. The FET's can be N-channel MESFET devices and operate by majority carrier transport. Hence, such devices have all the above-described advantages and will provide power division with gain and extreme reliability.

As further indicated, the phase delay networks 90 and 91 can be implemented by means of all pass LC networks whereby such networks will operate to pass a wide band of frequencies at constant amplitudes giving all frequencies in that band the desired phase shift. As one will understand, the amplitude of the transfer function of the constant resistance LC all pass network is unity at any frequency. Therefore, the amplitude tracking between the two paths is excellent.

The desired phase difference between the two all pass networks as 90 and 91 at a certain desired frequency can be set by selecting proper values of inductances and capacitors. Nearly constant phase differences over very broad band frequency ranges can be achieved by simply cascading two or more all pass networks as 90 and 91 with properly chosen resonant frequencies. Such all pass networks provides circuits which are completely symmetrical and signal can flow from the input to the output or from the output to the input, and hence the circuit is inherently bidirectional.

For additional information concerning the properties of such all pass networks, reference is made to an article entitled "Properties of Some Wide Band Phase Splitting Networks" published in the *Proceedings of the IRE*, February 1949 by D.G.C. Luck on pages 147 to 151. In that article there is shown passive networks that produce polyphase outputs from single phase inputs over wide frequency bands. The article reviews the properties of such circuitry which are useful in such networks and expressions are derived for the phase difference produced between branches as a function of frequency. The article is pertinent to certain of the all pass networks which can employed to implement networks 90 and 91 of FIG. 6. In any event, the above-noted copending application entitled BIDIRECTIONAL DIGITAL PHASE SHIFT APPARATUS shows many examples of suitable networks which can be employed for networks 90 and 91.

Figure 7:
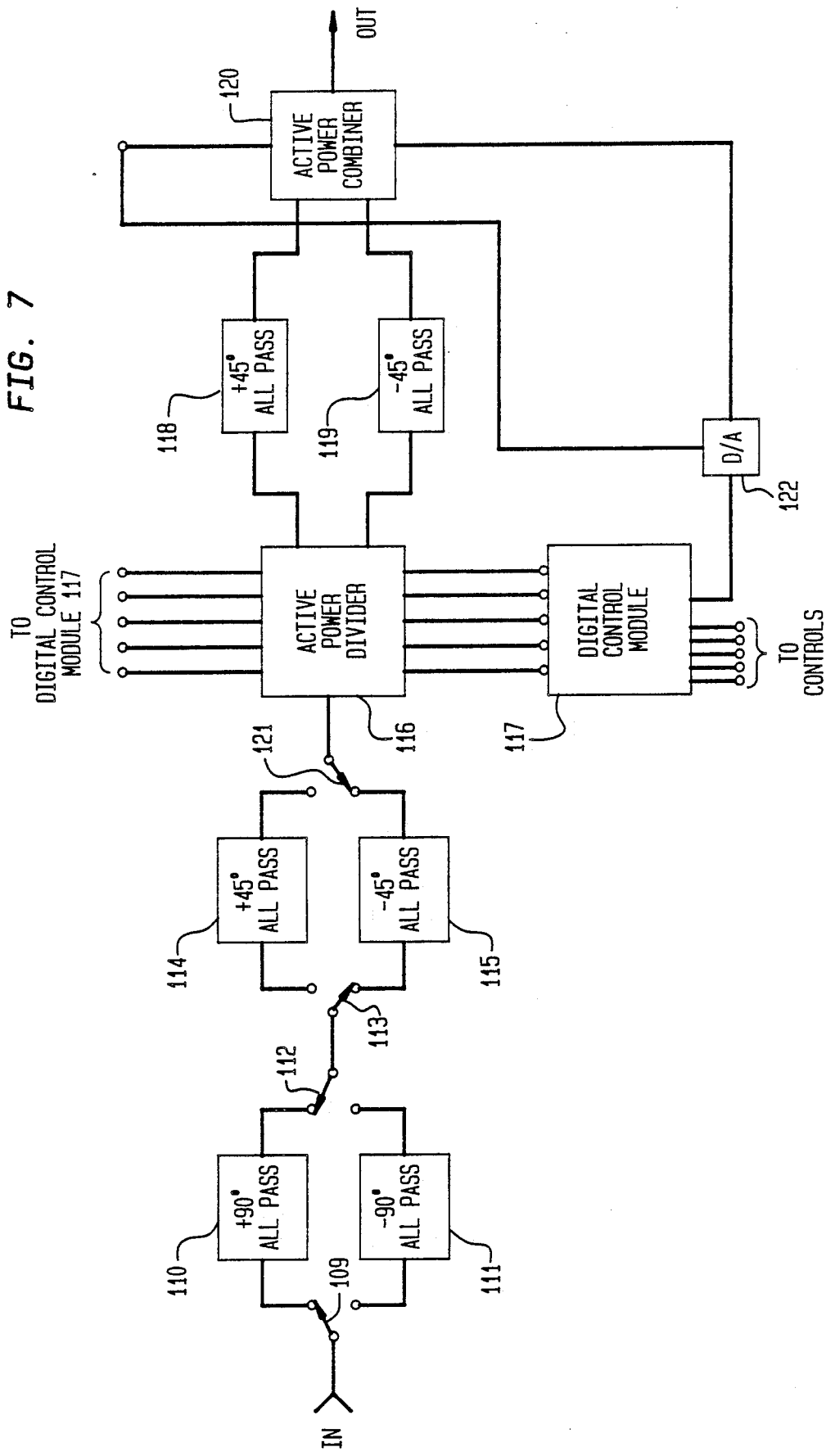
FIG. 7 is a block diagram of a digitally controlled active phase shifter apparatus with vernier control.

Referring to FIG. 7, there is shown a schematic block diagram of a monolithic 5-bit phase shifter which operates according to the teachings of this invention and will be more clearly described. In any event, as one can see from FIG. 7, an input signal is applied to a single pole double throw switch 109 which can select either the input of all pass network 110 or all pass network 111. The all pass networks 110 and 111 are all pass constant resistance LC networks as described above. All pass network 110 provides a phase shift of +90 degrees while all pass network 111 provides a phase shift −90 degrees.

There is shown a single pole double throw switch 112 which can select the output of either all pass network 110 or 111. The common contact of switch 112 is directed to another switch 113 which is also of an SPDT configuration. The switch 113 can select the input of all pass network 114 or all pass network 115 thereby affording an additional phase delay of +45 degrees or −45 degrees. There is shown an output switch or SPDT 121 which selects the output from network 114 or network 115 to apply the selected output to the input of an active divider 116 which is of the configuration shown in FIG. 6. The active power divider 116 has output control terminals which are coupled to a digital control module 117 which can thereby select the cascode pairs in either path of the active power divider. The first path of the active power divider 116 is applied to an all pass network 118 which provides a phase shift of +45 degrees while the second output of the active power divider is applied to the input of a second all pass network 119 which provides a phase shift of −45 degrees. The outputs of networks 118 and 19 are applied to an active power combiner 120 such as the power combiner shown in FIG. 6 including FET's 100, 101, 102, and 103. The output of the active power combiner provides the output signal for the device.

The vernier control terminals of the active power combiner can be directed and controlled through the digital control module 117 by means of a digital to analog converter 122 which will convert digital signals into analog signals. This can provide vernier control to the active power combiner to thereby provide any phase variation between 0 and 90 degrees as desired. It is also understood that the digital to analog converter 122 may be eliminated as the active power combiner 120 can be controlled by various other means such as potentiometers or variable voltage control circuits such as saw tooth control generators and so on.

As indicated, FIG. 7 is a block diagram of a monolithic 5-bit phase shifter. The term 5-bit is indicated due to the phase incremental control of 11.25 degrees (360 degrees/25) of the phase shifter. Such monolithic 5-bit phase shifters have been fabricated utilizing MMIC techniques and employing N-channel MESFET's. Such devices can operate over a frequency range of 8–11 GHz with 5 bits of phase control implementing a phase incremental control of 11.25 degrees. The devices as shown in FIG. 7 produce an amplitude error of ±0.5 db with a phase error of ±2 degrees and a loss from input or output of 0 db. The entire circuit can be fabricated on a chip which is 5×2×0.1 mm.

As one can ascertain, this is an extremely small chip. The chip may include the digital control module 117 or the module 117 can be external to the chip. For present purposes it is preferred that the control module 117 be external to the chip. As one will further understand, the digitally controlled monolithic active phase shifter provides the following desirable features. There is no loss from input to output due to the active nature of the power divider and the power combiner which can provide gain as described above. The use of the cascode configuration for the power divider and the power combiner employing a common gate FET as a switch provides high reverse isolation between input and output of the non-operative device.

The circuit can produce any phase bit with a constant amplitude. The variation of the input impedance of the power divider is small for all possible vectors and this provides small incident phase error. As indicated the vernier control in the power combiner provides the capability of adjusting each phase bit to its finest accuracy or to be used as an analog bit. The circuit is broad band and of a small size.

Figure 8:
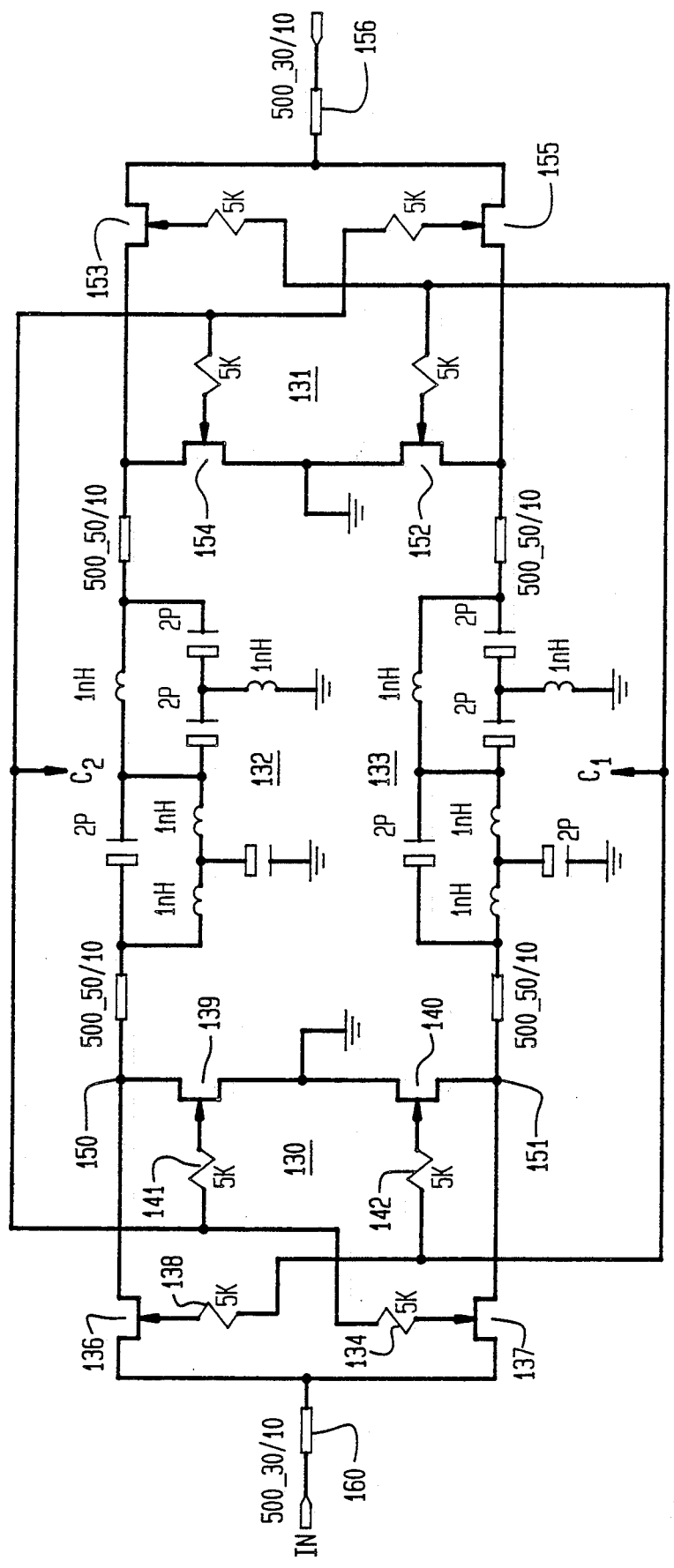
FIG. 8 is a schematic diagram of a 90 degree bidirectional phase shifter which circuit configuration can also be employed for a 180 degree bidirectional phase also be employ shifter.

Referring to FIG. 8, there is shown a schematic diagram of a bidirectional 90 degree phase bit. The 90 degree phase bit consists of two bidirectional SPDT switches 130 and 131 and a +45 degree and a −45 degree all pass network as network 132 and 133. The 180 degree phase bit uses a +90 degrees and a −90 degree all pass network. As one can ascertain from FIG. 8, the all pass networks 132 and 133 Consist of inductors and capacitors. These all pass networks are strictly LC networks and have constant resistance at any frequency. Both networks 132 and 133 employ two all pass networks which are in cascade one with the other. As one can ascertain from FIG. 8, an input signal applied to input terminal 160 is directed to the common drain electrodes of two symmetrical FET transistors 136 and 137. The transistors 136 and 137 have their drain electrodes coupled together and connected to the input terminal which is further in series with a suitable impedance conversion device 130 which may be for example a transmission line. The source electrode of device 136 is directed to the input terminal 150 of the all pass network 132. Shown coupled to terminal 150 is a second field effect transistor 139 having its drain to source path in series with a point of reference potential.

In a similar manner, the source electrode of FET 137 is coupled to the input terminal 151 of the all pass network 133. A FET transistor 140 has its drain-to-source path coupled between terminal 151 and the point of reference potential in a similar configuration as for example shown for transistor 139. As one can ascertain, the gate electrodes of transistor 136 and 140 are coupled respectively through resistors 138 and 142 to a control terminal designated as C1. In a similar manner, the gate electrodes of transistor and 139 in series with gate resistors 134 and 141 are coupled to a control terminal designated as C2. If a positive voltage is applied to terminal C1, both transistors 136 and 140 will be rendered conductive or switched to the ON state.

The conduction of transistor 136 causes the input signal at terminal 160 to be applied to the input 150 of the all pass network 132. The conduction of transistor 140 assures that no signal would be applied to terminal 151 at the input to the all pass network 133. Upon application of the positive voltage to terminal C1, FET's 153 and 152 in the output switch 131 also conduct. In this manner an input signal is, directed through transistor 136 to the input terminal 150 of the all pass network 132 and is directed via transistor 153 to the output terminal 155. Transistor 152 is also rendered conductive by the control signal C1 and operates to shunt the output terminal of all pass network 133.

If a positive potential were applied to terminal C2, this would cause transistors 137 and 139 to conduct thus causing the input signal to be applied via transistor 137 to the input of all pass network 133. The output from all pass network 133 would be directed via transistor 155 to the output terminal 156. Transistor 154 also conducts to thereby shunt the output of network 132 to ground. Thus as one will understand from FIG. 8, the bidirectional 90 degree or 180 degree phase bit employ two symmetrical SPDT switches as 130 and 131. The FET's employed in SPDT switches 130 and 131 are N-channel devices which are fabricated on a gallium arsenide substrate. These devices are fabricated on such substrates utilizing MMIC technology and the FET's shown in FIG. 8 have gate widths of 300 um. Due to the use of such types of transistors, insertion loss of the typical 90 degree and 180 degree phase bits as shown for example in FIG. 8 is about 1.5 db over a frequency range between 7 to 11 GHz. Apart from this, it is indicated that the third order intercept point (IP3) of such a bidirectional series switch having such gate widths is approximately 49 dbm. The third order intercept point being of such a large value indicates that there will be extremely low third order intermodulation products developed by this circuit. As one can understand, a problem utilized with phase shifters or other devices employing active elements such as FET's is that the active elements behave nonlinearly as they are not a completely linear device In this manner one can experience harmonic distortions due to the nonlinear operation of such devices where a device will behave as an actual mixer and produce harmonics of the input signal. By fabricating the transistors in the symmetrical manner shown in FIG. 8 with specified gate widths, one can provide a third order intercept point for the bidirectional SPDT switches which is approximately 49 dbm and hence one can assure that the circuit will operate reliably and produce relatively low odd order intermodulation distortion.

Figure 9:
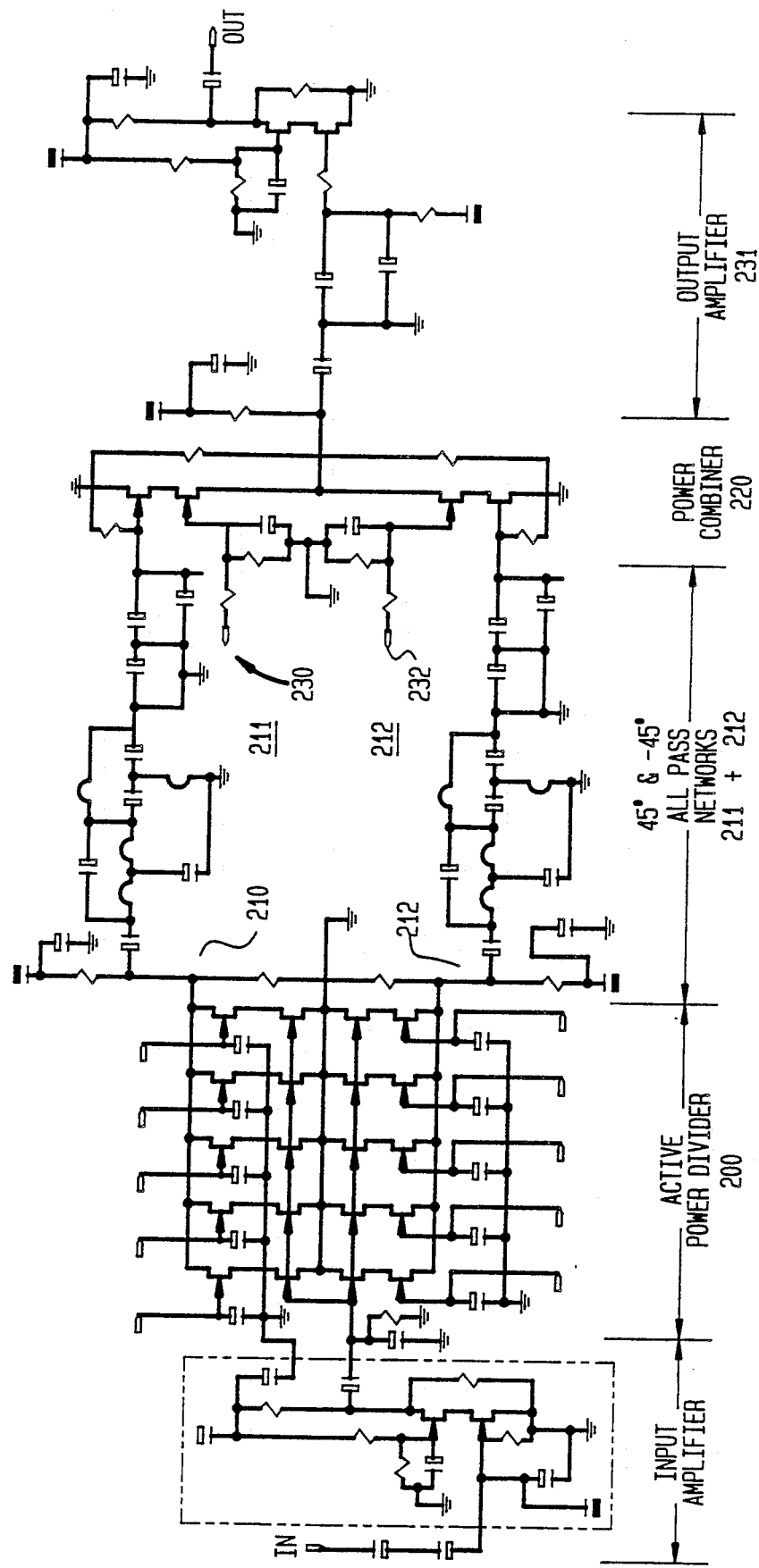
FIG. 9 is a detailed schematic diagram of a 0 to 90 degree vector generator.

Referring to FIG. 9, there is shown a schematic of a 0 to 90 degree vector generator. The vector generator consists of an active power divider 200 which is the same power divider as shown in FIG. 6. The vector generator employs the active power divider to operate with sine and cosine functions The sine and cosine functions are generated by using the cascode circuits each having varying gate widths to provide different amplitudes. As indicated in conjunction with FIG. 6, one output path 210 of the power divider is fed into a +45 degree all pass network configuration 211 while the other output of the power divider 212 is fed to a −45 degree all pass network configuration 213. This produces two orthogonal signals These orthogonal signals are then combined through the active power combiner 220 at the output of the all pass networks. The active power combiner 220 is the type of power combiner shown in FIG. 6 and employs cascode arrangements of output transistors (as transistors 101 and 102 of FIG. 6) having vernier voltages applied to the gate electrodes via the inputs shown in FIG. 9 as 230 and 232. The output of the power combiner is coupled to a conventional output amplifier 231. By utilizing the circuit configuration shown in FIG. 9, one can combine orthogonal signals via the active power combiner to generate phase shifts from 0 to 90 degrees with phase increments of 11.25 degrees or 5.625 degrees depending upon the relative amplitudes and control of the two orthogonal 45 degree signals. The relative amplitudes of the two signals are selected such that the amplitude of the resulting signal is always constant. The vector generator shown in FIG. 9 is an active device in that it employs an active power divider and an active power combiner Such a vector generator has been built with 8 to 10 db of gain and with extremely high IP3. It is understood that the input amplifier stage for example shown in FIG. 9 may be removed to reduce total power dissipation.

As one will understand, the use of cascode FET's is extremely important as for example compared to dual gate FET's A cascode FET can be computer modeled more accurately and therefore the exact functions of the circuit as shown in FIG. 9 can be diagnosed and implemented by using computer modeling. In this manner the complete circuit operation can in fact be totally specified. The cascode devices provide higher isolation then dual gate devices and are more reliable in regard to power handling capabilities. The circuit shown in FIG. 9 can be utilized as a 5-bit or 6-bit phase shifter and if utilized as a 5-bit phase shifter will provide 11.25 degree increments of phase shift and as employed as a 6-bit phase shifter will provide 5.625 degree phase shift increments.

Figure 10:
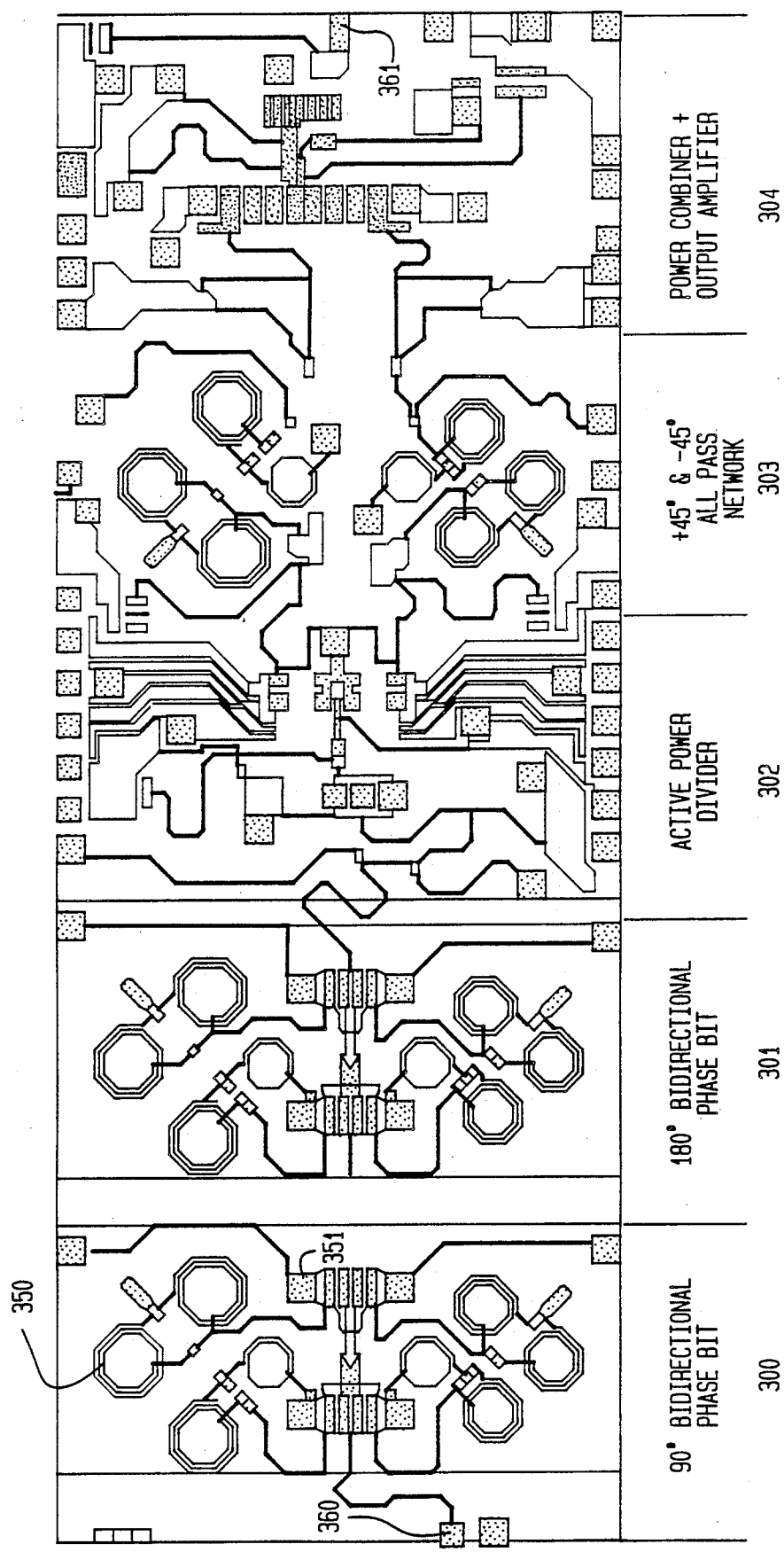
FIG. 10 is a top plan view of an integrated circuit layout of a phase shifter apparatus according to this invention for operation in the X band range.

Referring to FIG. 10, there is shown an enlarged view of a monolithic 5-bit phase shifter in MMIC format and capable of operating at a frequency range between 8 to 11 GHz. As one can ascertain from FIG. 10, the first input structure consists of the 90 degree bidirectional phase bit 300. As seen, the integrated circuit includes integrated inductors as for example inductor 350 as well as integrated capacitors, including FET devices as device 351. The next section consists of the 180 degree bidirectional phase bit 301 also including passive devices as FET devices, inductors and capacitors. The active power divider with digital adjustable amplitude control is shown as 302. There is shown a series of terminal pads designated as 360 and 361 which are inputs and output terminals for the integrated circuit The active power divider 302 is followed by the +45 and −45 degree all pass networks 303 and finally there is shown the power combiner and output amplifier designated as 304.

Such monolithic circuits as shown in FIG. 10 may be formed by an epitaxial process or an ion implantation process. It is well known that the circuit elements shown on FIG. 10 can be formed on monolithic circuit boards as GaAS substrates and which elements may include transmission lines, overlay or interdigital capacitors, lumped spiral inductors, thin film resistors, MESFETS and various other components. It is understood that since space is at a premium, lumped elements are preferred to distributed elements. The preferred transmission lines which can be implemented are microstrip and coplanar wave guide. The microstrip line has less loss and can be made with a characteristic impedance as high as 90 Ohms on for example a 100 to 125 um GaAS substrate Since the complete circuit is manufactured using automated techniques, no final adjustments can be made on it after it has been produced. In this manner, a circuit design must rely heavily on computer modeling and optimization. As indicated above, it is based on these considerations that the circuits, for example the active divider, employs cascode arrangements of FET's which can be computer modeled in an efficient and reliable manner. This aspect of the circuit design also affects the design of the bidirectional switches as well as the active power combiners wherein all these circuits can be easily implemented by computer models. The lumped overlay capacitor can provide between 0.5 picofarads (pf)to as high as 70 pf. For a one pf capacitor at 10 GHz the Q would lie between 50 and 100. The single loop inductor can provide two nH of inductance up to 18 GHz. It is easy to implement single loop inductors with Q's between 40 and 80 at 10 GHz.

The MESFET devices are relatively easy to make and are employed in cascode arrangements as for example shown for the power divider, the power combiner as well input and output amplifiers. The circuit shown in FIG. 10 is implemented on a chip approximately 5×2×0.1 mm. It is operated in a frequency band between 7 to 11 GHz with insertion losses of less than 0 db. Extremely low voltage standing wave ratios (VSWR) at the input and a third order intercept point of +40 dbm or greater at an operating temperature between 0 to +40 degree C. can be accommodated. The device is an extremely reliable device with low insertion losses and operates as a X band phase shifter.

We claim:

1. A digitally controlled active phase shifter apparatus operative to shift the phase of a signal within a given frequency range as applied to an input terminal between 0-90 degrees at an output terminal, comprising:

phase bit means having an input adapted to receive said input signal to provide at an output a signal shifted in phase by a given phase angle, active power divider means having an input coupled to said output of said phase bit means, said power divider including first and second power divider paths, each path including a plurality of cascode FET devices, with each device comprising a first FET arranged in a cascode stage configuration with a second common gate FET, with each of said first and second FET's having a gate electrode, a source electrode and a drain electrode, with the gate electrodes of said first FET's in each device connected together and coupled to said input of said power divider means and with the gate electrodes of said common gate FET's each adapted to receive a first control signal for selectively biasing each cascode stage ON or OFF, with the drain electrodes of said common gate FET's in said first path connected together to provide a first output of said power divide means and with the drain electrodes of said common gate FET's in said second path connected together to provide a second output of said power divider means, with the source electrodes of said first FET's in each device connected together to a point of reference potential, a pair of phase delay networks with a first one operative to provide a given fixed phase delay of a given polarity and having an input coupled to said first output of said power divider, and a second one operative to provide an opposite polarity given phase delay and having an input coupled to said second output of said power divider, each of said phase delay networks having a respective output, an active power combiner means having a first and second pair of FET's, each FET pair is in a cascode configuration with each FET having a gate electrode, a source electrode and a drain electrode with one FET in said first pair having the gate electrode coupled to said output of said first network and one FET in said second pair having the gate electrode coupled to said output of said second network with the source electrodes of said one FET's coupled to a point of reference potential with the other FET in each pair arranged in a common gate configuration and having the gate electrode adapted to receive a second control signal, with the drain electrodes of said common gate FET's coupled together to provide said output terminal for said phase shifter, digital control means coupled to said gate electrode of said common gate FET's of said power divider to select cascode stages of said power divider according to a desired phase shift to be implemented via said first and second paths, whereby said power combiner can combine said signals from said power divider to provide a phase shift for said input signal between 0-90 degrees at said output terminal.

2. The digitally controlled phase shifter according to claim 1, wherein said phase bit means includes a 90 degree phase bit in series with a 180 degree phase bit.

3. The digitally controlled phase shifter according to claim 2, wherein said 90 and 180 degree phase bits are bidirectional phase bits.

4. The digitally controlled phase shifter according to claim 1, wherein said gate electrodes of said common gate FET's in said combiner are coupled to a vernier control source to provide additional phase variation of the combined signal within said range of 0-90 degrees.

5. The digitally controlled phase shifter according to claim 1, wherein said pair of phase delay networks provide a given phase delay of +45 degrees for said first network and −45 degrees for said second network.

6. The digitally controlled active phase shifter apparatus according to claim 1, wherein certain of said cascode FET devices in said first and second paths have different gains than other of said devices in said first and second paths.

7. The digitally controlled active phase shifter apparatus according to claim 1, wherein first selected ones of said cascode FET devices in said active power divider means include first and second FET's each having a given gate width, and wherein other selected ones of said cascode FET devices include first and second FET's each having a different gate width than that of said first selected FET devices whereby said first selected devices have a different gain than said other selected devices.

8. The digitally controlled active phase shifter according to claim 1, wherein said phase bit means includes a first phase bit network for providing a first phase shift at a given angle at an output and a second phase bit network for providing a second phase shift at an angle which is the negative of said given angle, each of said phase bit networks having an input for receiving said input signal and an output for providing said phase shifted output signal, first switching means having a common terminal adapted to receive said input signal and a first terminal coupled to said input terminal of said first network and a second terminal coupled to said input terminal of said second network whereby said input signal can be selectively applied to said first or said second network.

9. The digitally controlled active phase shifter according to claim 8, further including, second switching means having a common terminal coupled to the input of said active divider means and a first terminal coupled to the output of said first network and a second terminal coupled to the output of said second network whereby the output of said first or second network can be selectively applied to the input of said active divider means.

10. A digitally controlled active phase shifter apparatus operative to shift the phase of a signal within a given frequency range as applied to an input terminal between 0-360 degrees at an output terminal, comprising:

a 90 degree phase bit having said input terminal adapted to receive said signal to provide at a first output a signal with a phase shift of 30 45 degrees and at a second output a signal with a phase shift of −45 degrees, first switching means coupled to said first and second outputs to select either said first or second output signals at an output terminal of said first switching means, a 180 degree phase bit having an input coupled to said first switching means output and operative to provide at a first output a signal with a phase shift of +90 degrees and at a second output a signal with a phase shift of −90 degrees second switching means coupled to said first and second outputs of said 180 degree phase bit to select either said first or second output signals at an output of said second switching means, an active power divider means having an input coupled to said output of said second switching means, said power divider including first and second power divider paths, each path including a plurality of cascode FET devices, with each device in said plurality including a first FET arranged in a cascode configuration with a second common gate FET, with each of said first and second FET's having a gate electrode, a source electrode and a drain electrode, with the gate electrodes of said first FET's connected together and coupled to said output of said second switching means and with the gate electrodes of said common gate FET's each adapted to receive a first control signal, to selectively bias each cascode stage ON or OFF, with the drain electrodes of said common gate FET's in said first and second paths connected together to form a first output for said first path and a second output for said second path, and with the source electrodes of said first FET's in each device connected together to a point of reference potential, a pair of phase delay networks with a first one operative to provide a +45 degree phase delay and having an input coupled to said output of said first path, and a second one operative to provide a −45 degree phase delay having an input coupled to said output of said second path, each of said phase delay networks having a respective output, an active power combiner means having a first and a second pair of FET's each FET pair is in a cascode configuration with each FET having a gate electrode, a source electrode and a drain electrode, with one FET in said first pair having the gate electrode coupled to the output of said first phase delay network, and with one FET in said second pair having the gate electrode coupled to the output of said second phase delay network, with the source electrodes of said one FET's coupled to a point of reference potential, with the other FET in each pair arranged in a common gate configuration and having the gate electrodes of said common gate FET adapted to receive a second control signal to provide additional phase variation, with the drain electrodes of said common gate FET's coupled together to provide said output terminal for said phase shifter, digital control means coupled to said gate electrodes of said common gate FET's of said power divider for providing said first control signal to select cascode stages of said power divider according to a desired phase shift to be implemented via said first and second path, and control means coupled to said gate electrodes of said common gate FET's in said active power combiner to provide said second control signal to combine said signals from said first and second paths, whereby said input signal can be selectively phase shifted from 0-90 degrees at said output terminal.

11. The digitally controlled phase shifter according to claim 10, wherein said input signal is in a frequency range between 8-11 GHz.

12. The digitally controlled active phase shifter according to claim 10, wherein said FET's in said power divider and power combiner are MESFET's.

13. The digitally controlled active phase shifter according to claim 10, wherein 90 degree phase bit is a passive network having a first all pass LC network for providing a phase shift at said first output of +45 degrees and a second all pass LC network for providing a phase shift at said second output of −45 degrees.

14. The digitally controlled active phase shifter according to claim 13, wherein said inputs of said first and second all pass networks are coupled respectively to a first terminal and a second terminal of a single pole double throw switch having a common terminal coupled to said input terminal to receive said input signal.

15. The digitally controlled active phase shifter according to claim 14, wherein said SPDT switch includes FET devices each having a source electrode, a drain electrode and a gate electrode with one FET having a source-to-drain path in series between said first and common terminals and a second FET having a source to drain path in series between said second and common terminals, and means coupled to said gate electrodes of said first and second FET's to bias one ON while the other is OFF to thereby couple either said first or second terminal to said common terminal.

16. The digitally controlled active phase shifter according to claim 10, wherein said first switching means is an SPDT switch having a first switch terminal coupled to said first output of said 90 degree phase bit and a second switch terminal coupled to said second output of said 90 degree phase bit, with a common switch terminal of said SPDT switch coupled to the input of said 180 degree phase bit.

17. The digitally controlled active phase shifter according to claim 10, wherein said 180 degree phase bit includes a first all pass LC network for providing a +90 degree phase shift at said first output of said 180 degree phase bit and a second all pass LC network for providing a −90 degree phase shift at said second output of said 180 degree phase bit, said first and second all pass networks each having a separate input and third switching means coupled to said inputs of said first and second all pass networks for applying either of said first or second outputs of said first switching means to the input of either said first or second all pass networks.

18. The digitally controlled active phase shifter according to claim 10, wherein certain of said FET's in said cascode devices have different gain factors than other cascode devices to thereby obtain different signal amplitudes depending upon which cascode devices are selected by said digital control means.

19. The digitally controlled active phase shifter according to claim 18, wherein first selected ones of said cascode FET devices in said active power divider means include first and second ET's each having a given gate width, and wherein other selected ones of said cascode FET devices include first and second FET's each having a different gate width than that of said first selected FET devices whereby said first selected devices have a different gain than said other selected devices.

20. The digitally controlled active phase shifter apparatus according to claim 18, wherein each FET as arranged in said common gate configuration has the gate electrode bypassed for input signal frequencies by a capacitor which is connected between said gate electrode and a point of reference potential.

21. The digitally controlled active phase shifter apparatus according to claim 18, wherein said FET's are N-channel MESFET's fabricated on a GaAs substrate.

22. The digitally controlled phase shifter according to claim 10, wherein said power divider has five cascode devices in said first path and five cascode devices in said second path.

23. The digitally controlled 5 bit phase shifter according to claim 10, wherein said phase shifter provides a phase shift between 0-90 degrees at 11.25 degree increments.

24. The digitally controlled 6 bit phase shifter according to claim 10, wherein said phase shifter provides a phase shift between 0-90 degrees at 5.625 degree increments.

25. The digitally controlled phase shifter according to claim 10, wherein said 90 degree phase bit, said first switching means, said 180 degree phase bit, said second switching means, said active power divider means, said pair of phase delay networks and said active power combiner means are all fabricated on a single Gaas substrate employing MMIC techniques.

26. The digitally controlled active phase shifter apparatus according to claim 10, wherein said 90 degree phase bit is a bidirectional phase bit.

27. The digitally controlled active phase shifter apparatus according to claim wherein said 180 degree phase bit is a bidirectional phase bit.

* * * * *

UNITED STATES PATENT AND TRADEMARK OFFICE
CERTIFICATE OF CORRECTION

PATENT NO. : 4,994,773

DATED : Feb. 19, 1991

INVENTOR(S) : Chen et al.

It is certified that error appears in the above-identified patent and that said Letters Patent is hereby corrected as shown below:

Cover Page

Section [73] insert --Assignee: Siemens Aktiengesellschaft, Berlin and Munich, Fed. Rep. of Germany--.

Before Section [57] insert --Attorney, Agent, or Firm-Jeffrey P. Morris--.

Signed and Sealed this

Twenty-ninth Day of September, 1992

Attest:

DOUGLAS B. COMER

*Attesting Officer*     Acting Commissioner of Patents and Trademarks